(12) United States Patent
Endean et al.

(10) Patent No.: US 12,012,327 B2
(45) Date of Patent: Jun. 18, 2024

(54) METHODS FOR VIBRATION IMMUNITY TO SUPPRESS BIAS ERRORS IN SENSOR DEVICES

(71) Applicant: Honeywell International Inc., Charlotte, NC (US)

(72) Inventors: Daniel Endean, Plymouth, MN (US); Andrew Brown, Saint Paul, MN (US); Mark Weber, Coon Rapids, MN (US)

(73) Assignee: Honeywell International Inc., Charlotte, NC (US)

( * ) Notice: Subject to any disclaimer, the term of this patent is extended or adjusted under 35 U.S.C. 154(b) by 348 days.

(21) Appl. No.: 17/189,745

(22) Filed: Mar. 2, 2021

(65) Prior Publication Data

US 2021/0284527 A1 Sep. 16, 2021

Related U.S. Application Data

(60) Provisional application No. 62/988,754, filed on Mar. 12, 2020.

(51) Int. Cl.
*B81B 7/00* (2006.01)
(52) U.S. Cl.
CPC ............ *B81B 7/0016* (2013.01); *B81B 7/008* (2013.01); *B81B 2201/0242* (2013.01); *B81B 2207/03* (2013.01)
(58) Field of Classification Search
CPC .................. B81B 7/0016; B81B 7/008; B81B 2201/0242; B81B 2207/03; G01C 19/5621; G01C 19/5719–5769
See application file for complete search history.

(56) References Cited

U.S. PATENT DOCUMENTS

| 5,635,640 A | 6/1997 | Geen |
| 7,213,458 B2 | 5/2007 | Weber et al. |
| 7,222,513 B2 | 5/2007 | Caron et al. |
| 7,231,824 B2 | 6/2007 | French et al. |
| 7,401,397 B2 | 7/2008 | Shcheglov et al. |
| 7,444,869 B2 | 11/2008 | Johnson et al. |

(Continued)

OTHER PUBLICATIONS

ST, "Everything about STMicroelectronics' 3-axis digital MEMS gyroscopes", TA0343 Technical Article, Jul. 2011, pp. 1 through 40, www.st.com.

(Continued)

*Primary Examiner* — Moazzam Hossain
(74) *Attorney, Agent, or Firm* — Fogg & Powers LLC (57) ABSTRACT

A method for tuning one or more sensor devices is provided, wherein each sensor device comprises one or more proof masses configured to move in response to an external stimulus of interest, and the one or more proof masses are also susceptible to move in response to one or more stimuli other than the external stimulus of interest. Each sensor device also comprises one or more pick-off mechanisms respectively associated with each of the one or more proof masses. The one or more pick-off mechanisms is proportionally responsive to a motion of the sensor device. The method for tuning includes adjusting gain of one or more of the pick-off mechanisms to reduce an output of each sensor device when the one or more proof masses move in response to the one or more stimuli other than the external stimulus of interest.

18 Claims, 8 Drawing Sheets

(56) References Cited

U.S. PATENT DOCUMENTS

| | | | |
|---|---|---|---|
| 7,481,109 | B2 | 1/2009 | Moore et al. |
| 7,565,839 | B2 | 7/2009 | Stewart et al. |
| 8,037,757 | B2 | 10/2011 | Johnson |
| 8,322,213 | B2 | 12/2012 | Trusov et al. |
| 8,783,103 | B2 | 7/2014 | Clark et al. |
| 9,074,889 | B2 | 7/2015 | Tsugai et al. |
| 9,404,747 | B2 | 8/2016 | Valzasina et al. |
| 10,371,521 | B2 | 8/2019 | Johnson |
| 2007/0227247 | A1* | 10/2007 | Weber ................ G01C 19/5776 73/496 |
| 2007/0245826 | A1 | 10/2007 | Cardarelli |
| 2009/0064781 | A1* | 3/2009 | Ayazi ................ G01C 19/5719 73/504.12 |
| 2012/0198934 | A1 | 8/2012 | Cardarelli |
| 2016/0084654 | A1 | 3/2016 | Senkal et al. |
| 2016/0102978 | A1* | 4/2016 | Liao ................ G01C 19/56 73/504.12 |
| 2016/0130133 | A1* | 5/2016 | Boillot ............... G01C 19/5762 73/504.12 |
| 2017/0184400 | A1 | 6/2017 | Valzasina et al. |
| 2018/0118557 | A1 | 5/2018 | Endean et al. |
| 2020/0088518 | A1 | 3/2020 | Endean |
| 2022/0049959 | A1* | 2/2022 | Wu .................... G01C 19/5755 |

OTHER PUBLICATIONS

European Patent Office, "Extended European Search Report from EP Application No. 21162369.9", from Foreign Counterpart to U.S. Appl. No. 17/189,745, filed Aug. 10, 2021, pp. 1 through 9, Published: EP.

Tatar et al., "Effect of quadrature error on the performance of a fully-decoupled MEMS gyroscope", MEMS, Jan. 2011, pp. 569 through 572, Cancun, Mexico, IEEE.

Israel Patent Office, "Office Action" Jun. 27, 2023, from IL Patent Application No. 281392, from Foreign Counterpart to U.S. Appl. No. 17/189,745, pp. 1 through 7, Published: IL.

\* cited by examiner

METHODS FOR VIBRATION IMMUNITY TO SUPPRESS BIAS ERRORS IN SENSOR DEVICES

CROSS REFERENCE TO RELATED APPLICATION

This application claims the benefit of priority to U.S. Provisional Application No. 62/988,754, filed on Mar. 12, 2020, which is herein incorporated by reference.

BACKGROUND

Micro-electro-mechanical systems (MEMS) devices and other sensor devices often use variable capacitive read-out techniques for measurements of motion of a proof mass or other structure in the device. Typically, this measurement is designed to isolate a specific type of motion. For example, the capacitors in a tuning fork gyroscope are configured to measure the differential motion between two proof masses which is proportional to rotation rate. These capacitors are specifically configured to exactly cancel out (by symmetry) the common-mode motion that would be caused by linear acceleration of the device.

However, all structures are fabricated with certain levels of unavoidable imperfections. Thus, imperfect cancellation of these capacitances or other unwanted motions in the device are unavoidable.

SUMMARY

A method for tuning one or more sensor devices is provided, wherein each sensor device comprises one or more proof masses configured to move in response to an external stimulus of interest, and the one or more proof masses are also susceptible to move in response to one or more stimuli other than the external stimulus of interest. Each sensor device also comprises one or more pick-off mechanisms respectively associated with each of the one or more proof masses. The one or more pick-off mechanisms is proportionally responsive to a motion of the sensor device. The method for tuning includes adjusting gain of one or more of the pick-off mechanisms to reduce an output of each sensor device when the one or more proof masses move in response to the one or more stimuli other than the external stimulus of interest.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

Methods for providing vibration immunity to suppress errors in sensor devices are described herein. The methods can be used to provide vibration immunity due to electro-mechanical intra device mismatch such as a capacitive mismatch, or other imperfections, in sensor devices such as gyroscopes or other devices (e.g., capacitive pick-off accelerometers).

The present approach addresses the presence of undesirable sensor device vibrations, such as parasitic/unwanted motions. The proof masses in an inertial sensor device can move in multiple paths, but such a device is designed to sense motion of the proof masses along a very specific path/mode. If the sensor device is imperfectly fabricated, the device may have sensitivity to undesirable motions, which may themselves be excited by certain vibrations.

In an exemplary method, a sensor device is provided that includes one or more proof masses configured to move in response to an external stimulus of interest. The one or more proof masses are also susceptible to move in response to one or more stimuli other than the external stimulus of interest. For example, the external stimulus of interest can be a Coriolis force, and the one or more stimuli other than the external stimulus of interest can include linear or rotational vibratory motions. The sensor device also includes one or more pick-off mechanisms respectively associated with each of the one or more proof masses. The pick-off mechanisms are proportionally responsive to a motion of the sensor device. The method adjusts a gain of the pick-off mechanisms to reduce an output of the sensor device when the proof masses move in response to the one or more stimuli other than the external stimulus of interest. For example, the gain can be adjusted to correct for proof mass imperfections, spring flexure imperfections, damping mismatches, damping coefficient asymmetries, or pick-off gain non-idealities.

As used herein, the term "path" (or "paths") means any motion in space of a mechanism of the sensor device. For example, a "path" can refer to the diverse range of possible motions that one or more proof masses in a sensor device can undergo. In another embodiment, the rim of a wine-glass resonator can resonate in a shape that bows like a football (opposite sides go in-and-out together, adjacent sides are out of phase), which could be a first path, for example. Also, as used in herein, the term "proportional" (or "proportionally") means any function $F(x)$ that creates an output y that depends on the input x, such that $y=Cx^3+d/x$, where C is a capacitive gap in the sensor device.

The present methods are particularly useful in addressing such issues that arise from fabrication imperfections of micro-electro-mechanical systems (MEMS) sensor devices, such as MEMS gyroscopes. For example, the present approach can compensate for fabrication imperfections by adjusting the voltages that bias pick-off capacitors used in MEMS sensor devices. The present method provides for tuning the voltages of capacitors in a sensor device to specifically null out the susceptibility of the sensor device to vibrations.

In one example embodiment, a gyroscope device comprises one or more proof masses configured to be driven into motion along a first path and responsive to a resultant Coriolis force along a second path. One or more capacitive pick-off mechanisms are respectively associated with the one or more proof masses. The capacitive pick-off mechanisms are proportionally responsive to a motion of the sensor device along the second path. A gain of the capacitive pick-off mechanisms is adjustable to reduce an output of the sensor device when the one or more proof masses move in response to a stimulus other than the Coriolis force.

The technical benefit of the present approach is to suppress bias errors in the reported rotation rate of the sensor device. Bias is the non-zero rotation rate reported by the sensor device in the presence of zero rotation. If vibratory motion excites a response in the sensor device through a mechanism other than a true rotation rate, this will result in bias within the sensor. Reduction in bias is an important metric for improving gyroscope performance to enable a product to be produced for high performance navigation applications.

The present methods can be used to tune a sensor device to suppress vibration sensitivity regardless of the source of the sensitivity. For example, the present methods can be used to address various imbalances that result from fabrication imperfections, such as capacitance imbalances, proof mass imbalances, spring/flexure imbalances, gain mis-matches between the amplifiers associated with each pick-off mechanism, or mismatches in damping between mechanical elements in the device. The voltages applied to the proof masses can be adjusted to compensate for any of these issues. The present methods correct for error biases (i.e., not true rotation rates) by adjusting voltages on capacitors to balance out the differences in capacitive gaps, proof mass sizes/weights, and springs/flexures.

As used herein, the term "bias" is the error which is independent of input. For example, if [out=SF*in +B] then B is the bias, which is a fixed error in the output independent of the input. A high performance device also requires a stable scale factor (SF), which is the proportionality constant. The present method is primarily concerned with B, but if SF changes over time, then SF can become a problem as well. The method can apply to SF problems, or higher order problems, such as [out=SF*in +B+NL2*in^2+NL3*in^3] to correct for NL2 or NL3, which in a good sensor are zero. In this case NL2 and NL3 are constants, representing non-linearity term 2 and non-linearity term 3.

The present tuning methods can be applied to vibratory sensor devices measured by one or more pick-off mechanisms, such as capacitive pick-offs, magneto-electric pick-offs, piezoelectric pick-offs, piezoresistive pick-offs, optical pick-offs such as Fabry Perot cavities or intensity readouts, inductive pick-offs, or tunnel junctions such vacuum field emission diodes. The present methods are applicable as long as there is a way to tune sensitivity of the pick-offs to balance out imperfections of the sensor devices.

In one approach, a tuning method can be used to solve the problem of a capacitive mismatch in the sensor device. For example, fabrication variations in the sensor device can cause capacitive gaps to be mismatched with respect to each other, such that the sensor device is sensitive to vibration. The present tuning method can be employed to solve this issue by adjusting the voltages on the capacitors in the sensor device to remove this effect. In this approach the capacitive gaps in the sensor device are measured, and then a set of equations can be used to calculate what the voltages need to be to compensate for differences in the capacitive gaps.

In one example, if the capacitive gap between a first proof mass and a first stator comb is one percent smaller than the capacitive gap between a second proof mass and a second stator comb, then a one percent greater voltage can be applied to the second stator than to the first stator. This is done to balance out the overall sensitivity of the pick-off to proof mass motion for the two proof masses.

Suppose the capacitive gap for the first proof mass is $C_1$ and the capacitive gap for the second proof mass is $C_2$. The output current produced by the first proof mass ($i_1$) then depends on the motion of the first proof mass ($x_1$) and the voltage applied to a first set of pick-off combs ($V_1$), as represented by the following equation:

$$i_1 = V_1 \frac{dC_1}{dx}\left(\frac{dx_1}{dt}\right) \quad (1)$$

Similarly, the output current produced by the second proof mass ($i_2$) depends on the motion of the second proof mass ($x_2$) and the voltage applied to a second set of pick-off combs ($V_2$), as represented by the following equation:

$$i_2 = V_2 \frac{dC_2}{dx}\left(\frac{dx_2}{dt}\right) \quad (2)$$

For a perfectly designed device, $dx_1/dt=-dx_2/dt$ during operation (such as sensing rotation rate as a gyroscope), $dC_1/dx=dC_2/dx$ and $V_1=-V_2$, so that the two signs of $i_1$ and $i_2$ sum in operating, producing twice the current as would be produced for a single proof mass. Assume then that an external vibration is applied to the device so that both proof masses move with common mode motion, $x_1=\sim x_2$. For a perfectly fabricated device, the total output current would be zero when the equations are summed. But if $dC_1/dx$ does not equal $dC_2/dx$, then the net output current (assuming $dx_1/dt=dx_2/dt$) is represented by the following equation:

$$i_{out} = \left(V_1\frac{dC_1}{dx} + V_2\frac{dC_2}{dx}\right)\left(\frac{dx}{dt}\right) \quad (3)$$

Thus, if $dC_1/dx$ and $dC_2/dx$ are measured, then $V_2$ can be adjusted to be equal to $-V_1*(dC_1/dx/dC_2/dx)$ so that the net output current is zero.

An automated method can be used to measure the capacitive gaps by using a wafer probe on a wafer with fabricated devices. When the sensor device is mounted on a circuit board, the voltages on the circuit board can be adjusted to match the voltages that were calculated. In another method, a shaker can be used shake a fabricated device, and the voltages are adjusted to get rid of vibration sensitivity.

The present tuning method can also be used to solve other issues that arise during device fabrication. For example, vibration susceptibility can arise from the fact that the mass of each of the proof masses differs from the other, or that mechanical flexures supporting these proof masses are unequal. In such cases, in equations (1) to (3) above, the more massive proof mass would move more than the smaller proof mass, so that $dx_1/dt$ would not equal $dx_2/dt$. In a similar way as with the capacitive mismatch, a voltage adjustment to the proof masses can be made to counteract the way these effects make the sensor device sensitive to vibration. In this case, $V_2=(dx_1/dt/dx_2/dt)*V_1$. The values of $V_1$ and $V_2$ could be obtained by operating the device with input vibration while adjusting $V_2$ until the output current is nulled or reduced to its minimum. In a similar way, the spring constants of the flexures in the device may not be perfectly balanced, which would also result in $dx_1/dt$ not equal to $dx_2/dt$ in the presence of external vibratory inputs.

Additionally, it should be noted that in a typical sensor device, the voltages biasing the capacitors change the device behavior mechanically. Known as electrostatic spring softening, the voltages specifically create an effective spring that changes the resonant frequency and damping of the device. The present tuning process may also be used to change the mechanical behavior of the motion directly, in addition to or instead of, the electrical pick-off sensitivity.

In other implementations of the present tuning approach, each proof mass's capacitive gaps can be connected to separate front end amplifiers. The gain of those amplifiers can be adjusted to deal with the capacitive mismatch. Furthermore, the signals can be digitized separately and the adjustment made in software. For example, gain changes can include changes that are adjusted as software coefficients.

The tuning process can be performed during factory calibration (once at the time of assembly) or dynamically during operation of the device. If the tuning is done dynamically during operation, a self-test method can be used to determine the necessary voltages. For example, the voltages might briefly be set through a series of different settings while known inputs are applied to the device. By determining the response of the device to these known inputs, the correct voltage for suppressing susceptibility can be periodically updated.

It should be noted that the present tuning method is not confined to situations where the capacitive mismatch (or other mismatch) is the result of fabrication imperfection. In some instances, a device may be intentionally designed so that its two proof masses have unequal capacitances or unequal motions. The present method applies equally well in such cases.

Further details of various embodiments are described hereafter with reference to the drawings.

Figure 1:
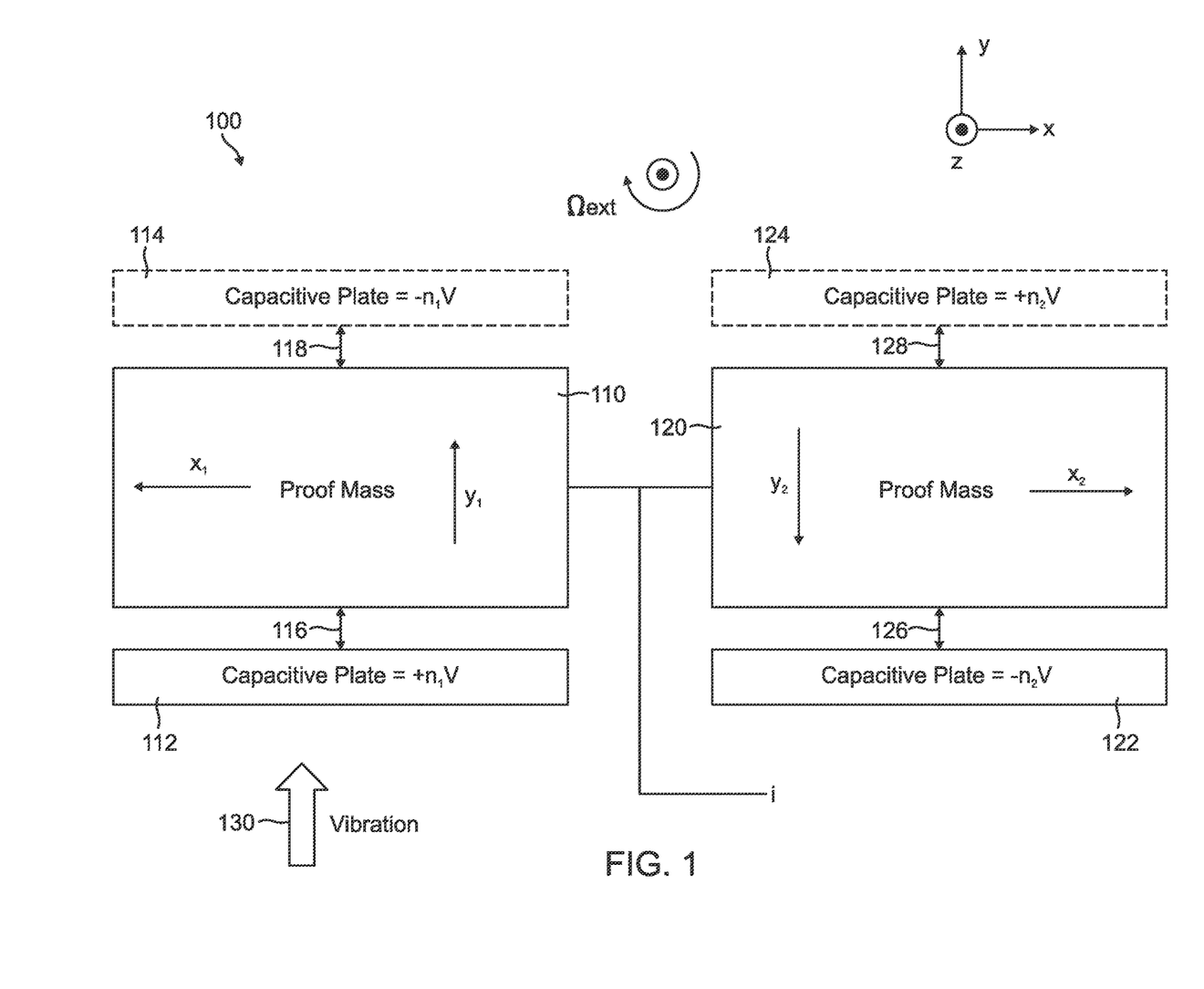
FIG. 1 is a schematic diagram of a sensor device having two proof masses, according to one embodiment.

FIG. 1 is a schematic diagram of a sensor device 100 such as a tuning fork gyroscope, according to one embodiment. The sensor device 100 has a first proof mass 110 and a second proof mass 120, as well as a set of capacitive pick-off mechanisms, including a capacitive plate 112 located on one side of proof mass 110, and an optional capacitive plate 114 located on an opposing side of proof mass 110. In addition, a capacitive plate 122 is located on one side of proof mass 120, and an optional capacitive plate 124 can be located on an opposing side of proof mass 120.

The proof mass 110 is separated from capacitive plate 112 by a capacitive gap 116. When optional capacitive plate 114 is used, proof mass 110 is separated from capacitive plate 114 by a capacitive gap 118. The proof mass 120 is separated from capacitive plate 122 by a capacitive gap 126. When optional capacitive plate 124 is used, proof mass 120 is separated from capacitive plate 124 by a capacitive gap 128.

The capacitive plates 112, 114 are biased with a first set of voltages (+$n_1$ V, −$n_1$ V), which in one example can be +5 V and −5 V. The capacitive plates 122, 124 are biased with a second set of voltages (−$n_2$ V, +$n_2$V), which in one example can be −5 V and +5 V. The first and second proof masses 110, 120 are movably coupled to a substrate so as to allow the proof masses to move relative to the substrate.

During operation of sensor device 100, the capacitive plates cause the proof masses to oscillate along a drive axis in an anti-phase mode with respect to each other. For example, if proof mass 110 and proof mass 120 are driven along an x-axis, then proof mass 110 moves toward the $x_1$ path, and proof mass 120 moves toward the $x_2$ path. The sensor device 100 is operative to sense the motion of proof masses 110 and 120, which move in opposite directions along a y-axis ($y_1$ and $y_2$ paths) in response to the Coriolis force caused by rotation of sensor device 100 about a z-axis (next). The Coriolis force arises due to the driven anti-phase motion ($x_1$ and $x_2$ paths).

The capacitive plates are biased such that a current (i) results from the device when anti-phase motion in the y-axis occurs between the proof masses. If the proof masses move with common-mode motion in the same y path, the configuration of voltages on the capacitive plates will result in zero net current exiting the device. The path of vibration that is of concern for sensor device 100 is indicated by arrow 130.

As described previously, a capacitive mismatch or other issues can arise due to fabrication imperfections of the sensor device. For example, fabrication variations in sensor device 100 can cause capacitive gaps 126, 128 to be smaller than capacitive gaps 116, 118. In this case, if proof masses 110, 120 both move along the positive y-axis, a larger negative current will be produced by proof mass 120 than the corresponding positive current produced by proof mass 110. Since a linear acceleration along the y-axis of sensor device 100 can cause the proof masses 110, 120 to experience the common-mode motion, sensor device 100 is sensitive to this vibration.

The present tuning method can be employed to reduce vibration sensitivity by adjusting the voltages on the capacitive plates to remove this effect. The capacitive gap differences in the sensor device are measured, and a determination is made as to the voltages needed to balance out the differences. For example, a larger voltage is applied to capacitive plates 112, 114 than the voltage applied to capacitive plates 122, 124, to counteract the smaller capacitance change (due to the larger capacitive gaps 116, 118).

Figure 2:
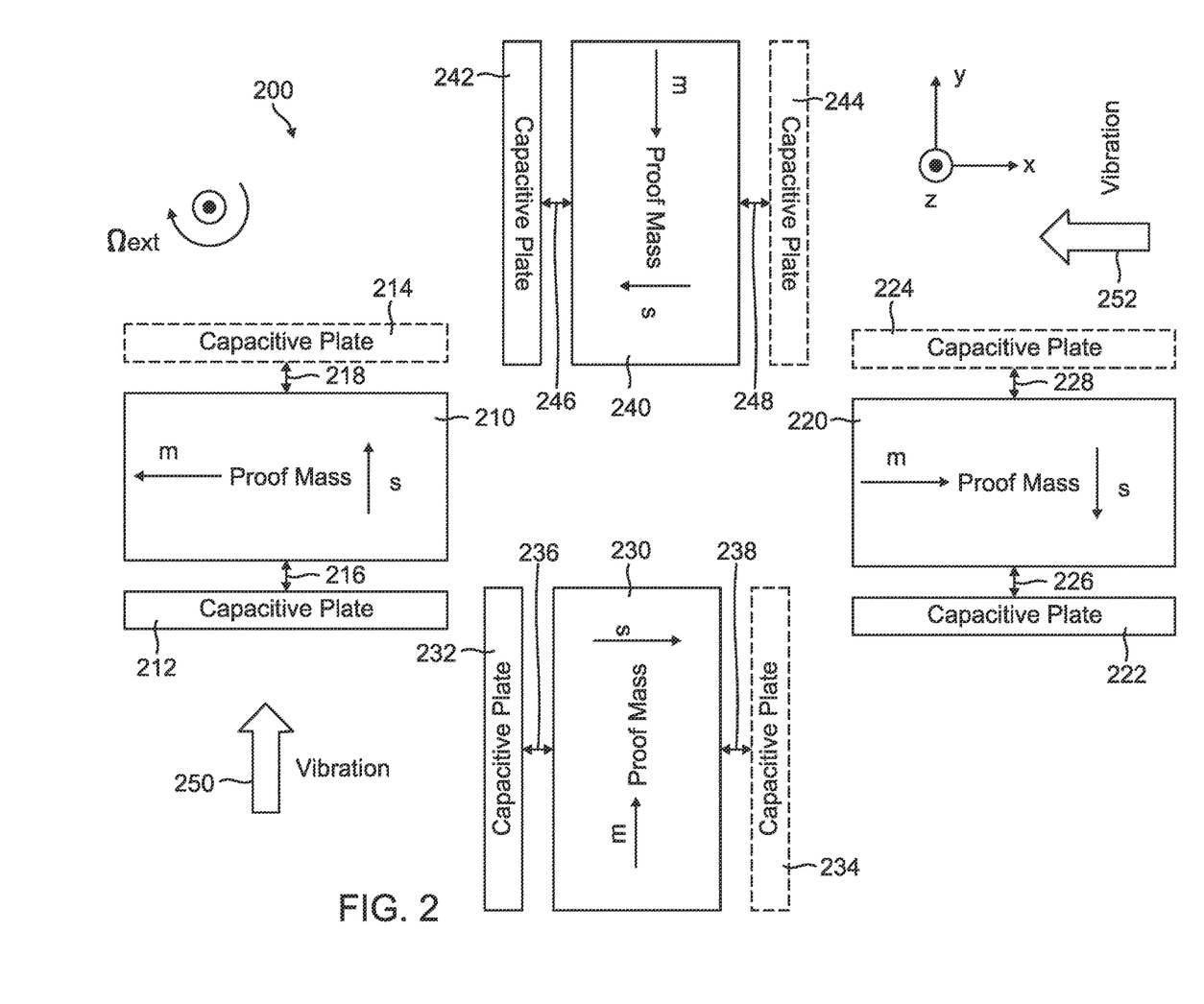
FIG. 2 is a schematic diagram of a sensor device having four proof masses, according to another embodiment.

FIG. 2 is a schematic diagram of a sensor device 200 such as a MEMS gyroscope, according to another embodiment. The sensor device 200 has a first proof mass 210, a second proof mass 220, a third proof mass 230, and a fourth proof mass 240. A capacitive plate 212 is located on one side of proof mass 210. An optional capacitive plate 214 can be located on an opposing side of proof mass 210. A capacitive plate 222 is located on one side of proof mass 220. An optional capacitive plate 224 can be located on an opposing side of proof mass 220. A capacitive plate 232 is located on one side of proof mass 230. An optional capacitive plate 234 can be located on an opposing side of proof mass 230. A capacitive plate 242 is located on one side of proof mass 240. An optional capacitive plate 244 can be located on an opposing side of proof mass 240.

The proof mass 210 is separated from capacitive plate 212 by a capacitive gap 216. When optional capacitive plate 214 is used, proof mass 210 is separated from capacitive plate 214 by a capacitive gap 218. The proof mass 220 is separated from capacitive plate 222 by a capacitive gap 226. When optional capacitive plate 224 is used, proof mass 220 is separated from capacitive plate 224 by a capacitive gap 228. The proof mass 230 is separated from capacitive plate 232 by a capacitive gap 236. When optional capacitive plate 234 is used, proof mass 230 is separated from capacitive plate 234 by a capacitive gap 238. The proof mass 240 is separated from capacitive plate 242 by a capacitive gap 246. When optional capacitive plate 244 is used, proof mass 240 is separated from capacitive plate 244 by a capacitive gap 248.

Each of the capacitive plates in sensor device 200 are biased with respective voltages. For example, capacitive plates 212 and 214 can be respectively biased with a first set of voltages (e.g., +5 V and −5 V); capacitive plates 222 and 224 can be respectively biased with a second set of voltages (e.g., −5 V and +5 V); capacitive plates 232 and 234 can be respectively biased with a third set of voltages (e.g., −5 V and +5 V); and capacitive plates 242 and 244 can be respectively biased with a fourth set of voltages (e.g., +5 V and −5 V).

During operation of sensor device 200, as proof mass 210 and proof mass 220 are driven outwardly away from each other in a motor mode (m arrows) along an x-axis, proof mass 230 and proof mass 240 are driven inwardly toward each other in a motor mode along a y-axis, during a vibratory state. In response to the Coriolis force caused by rotation of sensor device 200 about a z-axis (next), a sense mode (s arrow) of proof mass 210 moves up along the y-axis, a sense mode of proof mass 220 moves down along the y-axis, a sense mode of proof mass 230 moves to the right along the x-axis, and a sense mode of poof mass 240 moves to the left along the x-axis.

The primary motions of vibration that are of concern for sensor device 200 are translational vibrations indicated by arrows 250 and 252, as well as rotational vibrations (dither vibrations) about the z-axis. While these are the primary motions of concern, other motions of concern exist as well. For example out-of-plane vibratory motion in the z-axis may cause disengagement of comb fingers. The present tuning method can be used to provide correction in this case if the disengagement is unequal.

As described previously, a capacitive mismatch or other issues can arise due to fabrication imperfections of the sensor device. For example, fabrication variations in sensor device 200 can cause variations in the capacitive gaps. The tuning process for sensor device 200 is a more complex process that involves simultaneous optimization of multiple voltages, to adjust sensitivity to vibration in two axes, but the overall process is similar to that described above for the two mass sensor device 100.

With the four proof masses in sensor device 200, there is a need to tune out multiple vibration sensitivities, but more tuning options are available. For sensor device 200, the voltages of capacitive plates 212, 214 and capacitive plates 222, 224 can be adjusted to reduce y-axis translation sensitivity. Additionally, the voltages of capacitive plates 232, 234 and capacitive plates 242, 244 can be adjusted to reduce x-axis translation sensitivity. Further, all four sets of capacitive plates can be adjusted as a group to adjust sensitivity of sensor device 200 to rotational vibration sensitivity about the z-axis.

Figure 3:
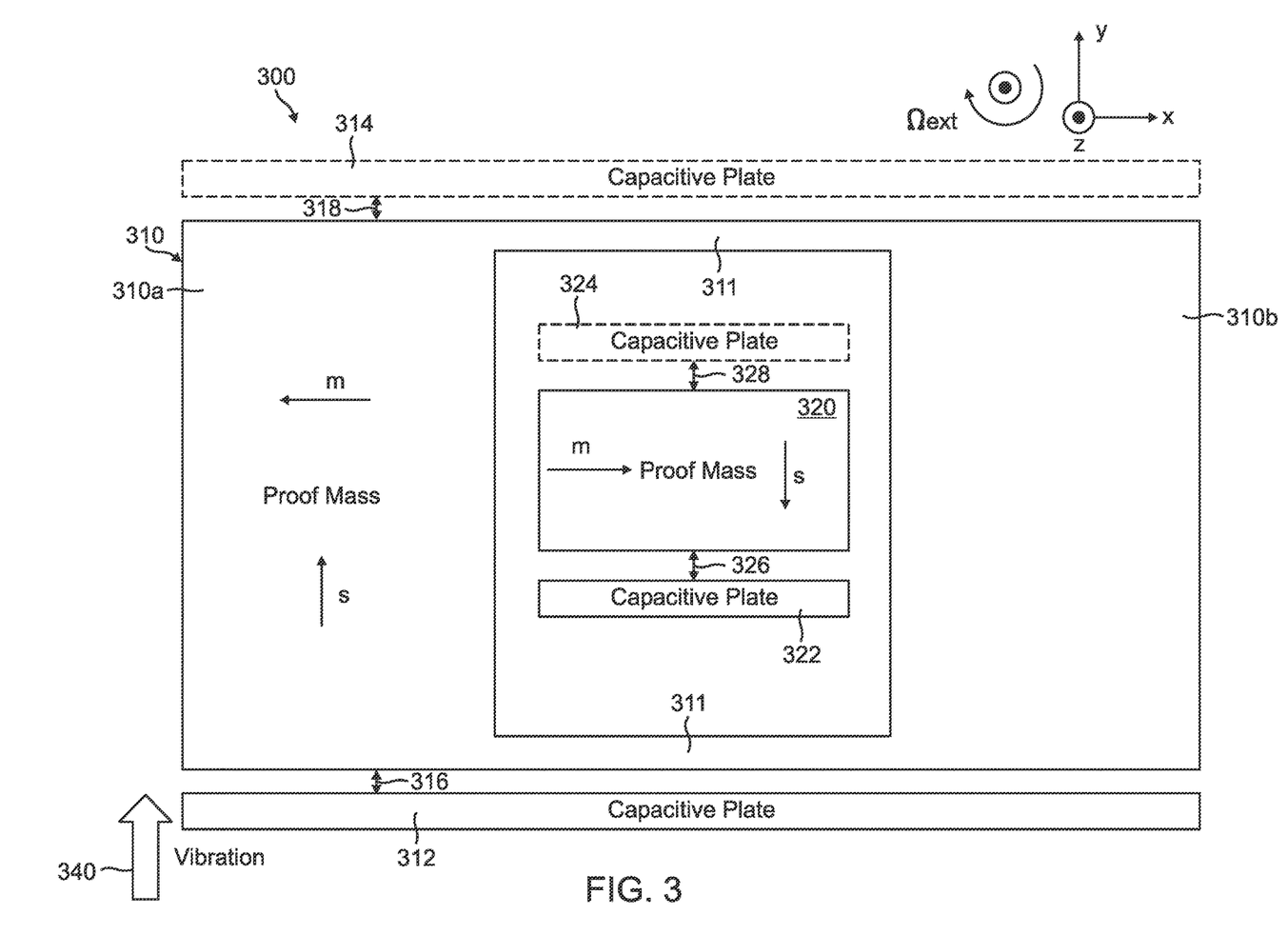
FIG. 3 is a schematic diagram of a sensor device having two proof masses, according to an alternative embodiment.

FIG. 3 is a schematic diagram of a sensor device 300 such as a MEMS gyroscope, according to a further embodiment. The sensor device 300 has a pair of proof masses, including a first (outer) proof mass 310 and a second (inner) proof mass 320. The first proof mass 310 includes a first proof mass portion 310a and a second proof mass portion 310b. The second proof mass 320 is interposed between first proof mass portion 310a and second proof mass portion 310b. The first and second proof mass portions 310a, 310b are directly connected to each other by connecting members 311 such as rigid trusses or other rigid structures.

A capacitive plate 312 is located on one side of proof mass 310. An optional capacitive plate 314 can be located on an opposing side of proof mass 310. In addition, a capacitive plate 322 is located on one side of proof mass 320. An optional capacitive plate 324 can be located on an opposing side of proof mass 320.

The proof mass 310 is separated from capacitive plate 312 by a capacitive gap 316. When optional capacitive plate 314 is used, proof mass 310 is separated from capacitive plate 314 by a capacitive gap 318. The proof mass 320 is separated from capacitive plate 322 by a capacitive gap 326. When optional capacitive plate 324 is used, proof mass 320 is separated from capacitive plate 324 by a capacitive gap 328.

Each of the capacitive plates in sensor device 300 are biased with respective voltages. For example, capacitive plates 312 and 314 can be respectively biased with a first set of voltages (e.g., +5 V and −5 V); and capacitive plates 322 and 324 can be respectively biased with a second set of voltages (e.g., −5 V and +5 V).

During operation of sensor device 300, as proof mass 310 is driven in a motor mode along an x-axis in one direction (left), proof mass 320 is driven in a motor mode along the x-axis in an opposite direction (right), during a vibratory state. In response to the Coriolis force caused by rotation of sensor device 300 about a z-axis (next), a sense mode of proof mass 310 moves along the y-axis in one direction (up), and a sense mode of proof mass 320 moves along the y-axis in the opposite direction (down). The primary motion of vibration that is of concern for sensor device 300 is a translational vibration indicated by arrow 340, as well as rotational vibrations (dither vibrations) about the z-axis.

As described previously, a capacitive mismatch or other issues can arise due to fabrication imperfections of the sensor device. For example, fabrication variations in sensor device 300 can cause variations in the capacitive gaps. In this case, the voltages of the various capacitive plates of sensor device 300 can be adjusted to cancel out y-axis translation motion as described previously.

The proof masses 310 and 320 have different mechanical shapes and thus will have different sensitivities to rotational vibration about the z-axis. In this case, each of the capacitive plates can be tuned in multiple parts to adjust sensitivity of sensor device 300 to rotational vibration about the z-axis.

Other imperfections that can cause issues include one proof mass of sensor device 300 being heavier than the other proof mass. In such a case, when vibration of sensor device 300 occurs in an x, y, or z direction, the heavier proof mass will move more than the lighter proof mass and will thus drive more current. Again, the voltages of the capacitive plates of sensor device 300 can be adjusted to counteract the difference in weights of the proof masses.

Figure 4:
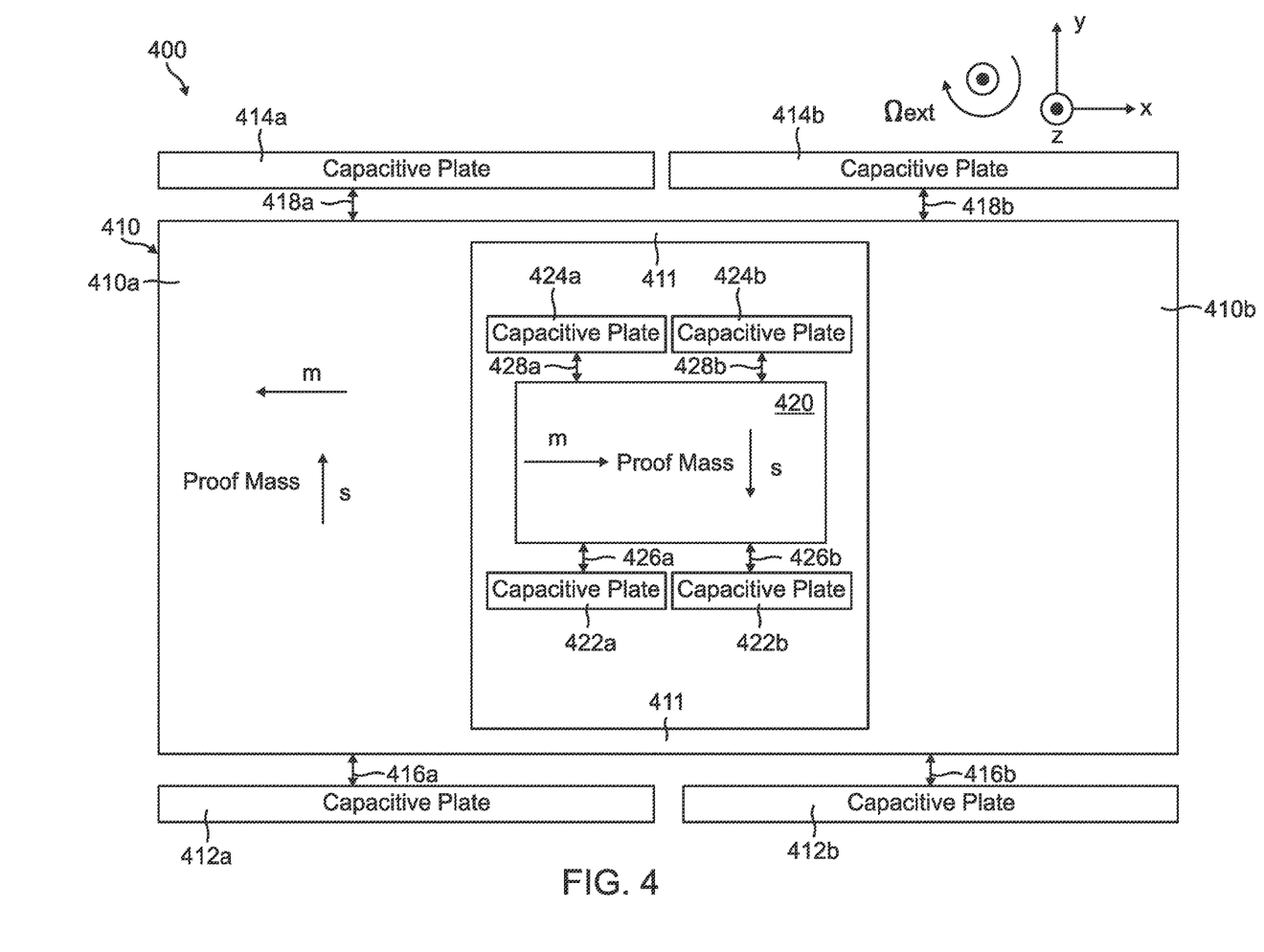
FIG. 4 is a schematic diagram of a sensor device having two proof masses, according to another alternative embodiment.

FIG. 4 is a schematic diagram of a sensor device 400 such as a MEMS gyroscope, according to an alternative embodiment. The sensor device 400 has a pair of proof masses, including a first (outer) proof mass 410 and a second (inner) proof mass 420. The first proof mass 410 includes a first proof mass portion 410a and a second proof mass portion 410b. The inner proof mass 420 is interposed between first proof mass portion 410a and second proof mass portion 410b. The first and second proof mass portions 410a, 410b are directly connected to each other by connecting members 411.

A first set of capacitive plates 412a, 414a are located on respective opposing sides of proof mass portion 410a. A second set of capacitive plates 412b, 414b are located on respective opposing sides of proof mass portion 410b. A third set of capacitive plates 422a, 424a are located on respective opposing sides of proof mass 420. A fourth set of capacitive plates 422b, 424b are also located on respective opposing sides of proof mass 420.

The first proof mass portion 410a is separated from the first set of capacitive plates 412a, 414a by respective capacitive gaps 416a, 418a. The second proof mass portion 410b is separated from the second set of capacitive plates 412b, 414b by respective capacitive gaps 416b, 418b. The proof mass 420 is separated from the third set of capacitive plates 422a, 424a by respective capacitive gaps 426a, 428a. The proof mass 420 is also separated from the fourth set of capacitive plates 422b, 424b by respective capacitive gaps 426b, 428b. Each of the capacitive plates in sensor device 400 are biased with respective voltages.

During operation of sensor device 400, as proof mass 410 is driven in a motor mode along an x-axis in one direction (left), proof mass 420 is driven in a motor mode along the x-axis in an opposite direction (right), during a vibratory state. In response to the Coriolis force caused by rotation of sensor device 400 about a z-axis (next), a sense mode of proof mass 410 moves along the y-axis in one direction (up), and a sense mode of proof mass 420 moves along the y-axis in the opposite direction (down).

As described previously, a capacitive mismatch or other issues can arise due to fabrication imperfections of the sensor device. For example, fabrication variations in sensor device 400 can cause variations in the capacitive gaps. In this case, the voltages of the various capacitive plates of sensor device 400 can be adjusted to cancel out y-axis translation motion as described previously.

The sensor device 400 having the additional capacitive plates (compared to sensor device 300) is particularly suited to a tuning method where vibratory rotation sensitivities can be removed. The proof masses 410 and 420 have different mechanical shapes and thus will have different sensitivities to rotational vibration about the z-axis. In this case, each of the capacitive plates can be tuned to adjust sensitivity of sensor device 400 to rotational vibration about the z-axis to tune out vibratory differences.

Figure 5:
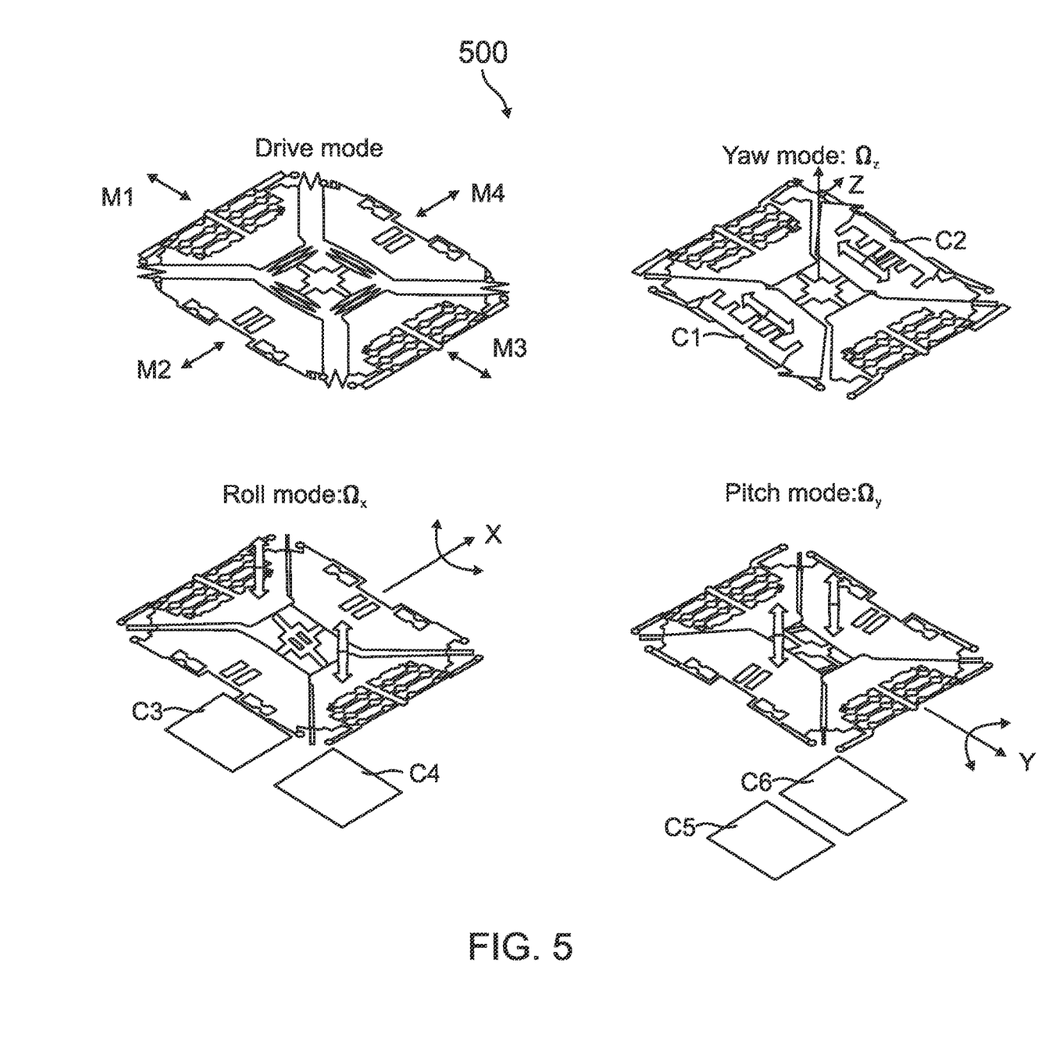
FIG. 5 is a schematic diagram of a gyroscope device, according to a further embodiment.

FIG. 5 is a schematic diagram of a gyroscope device 500, according to another embodiment, for which the present tuning method can be employed. The gyroscope device 500 has a single set of four moving proof masses (M1, M2, M3, M4) in a drive mode, and gives angle rate information in all three axes (x, y, z). A similar gyroscope device is described in the technical article entitled *Everything about STMicroelectronics' 3-axis digital MEMS gyroscopes*, TA0343, July 2011, pp. 1-40 (https://www.elecrow.com/download/TA0343.pdf), the disclosure of which is incorporated by reference herein.

A yaw mode ($\Omega_z$) of gyroscope device 500 is very similar to the embodiment of FIG. 1 in terms of how the present tuning method can be implemented. A set of pick-off capacitors C1 and C2 are interdigitated comb fingers that are interlaced with the proof masses. In one example, pick-off capacitors C1 and C2 can be biased with a first set of voltages such as +5 V and −5 V. A roll mode ($\Omega_x$) of gyroscope device 500 utilizes a pair of pick-off capacitors C3 and C4 under proof masses M1 and M3. In one example, pick-off capacitors C3 and C4 can be biased with a second set of voltages such as +5 V and −5 V. A pitch mode ($\Omega_z$) of gyroscope device 500 has a pair of pick-off capacitors C5 and C6 under proof masses M2 and M4. In one example, pick-off capacitors C5 and C6 can be biased with a third set of voltages such as +5 V and −5 V.

The present tuning method can be used to adjust the voltages on the pick-off capacitors in gyroscope device 500, to reduce the sensitivity to vibrations along the three axes. Optional pick-off capacitors are not shown for gyroscope device 500, but would be opposite the respective proof mass part from the illustrated pick-off capacitors.

Figure 6:
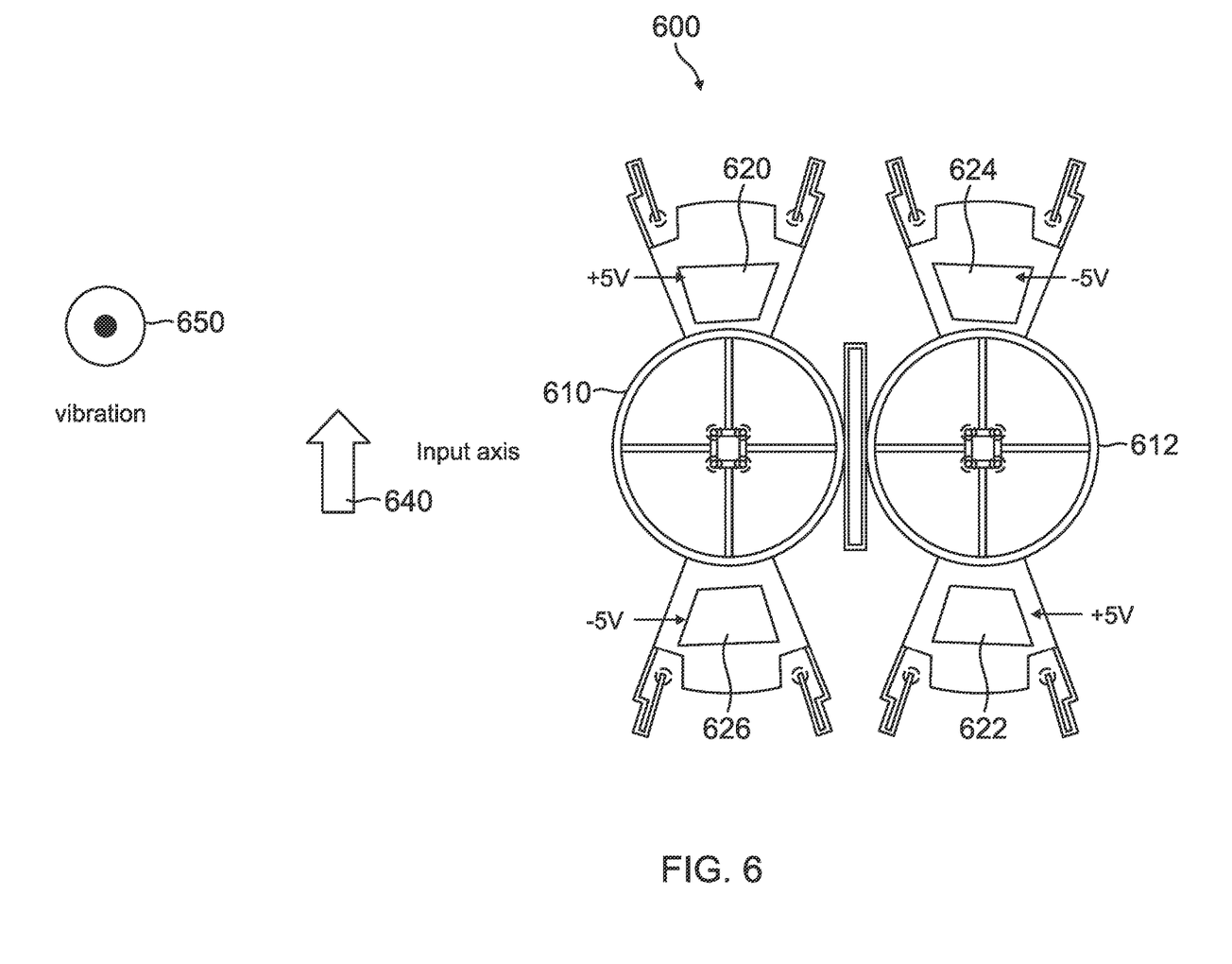
FIG. 6 is a schematic diagram of a sensor device, according to another embodiment.

FIG. 6 is a schematic diagram of a sensor device 600, such as a gyroscope, for which the present tuning method can be employed. A similar sensor device is described in U.S. Pat. No. 5,635,640, entitled Micromachined Device with Rotationally Vibrated Masses, the disclosure of which is incorporated by reference herein.

The sensor device 600 has a pair of circular proof masses 610 and 612, which are configured to dither back and forth in an angular fashion in opposite directions. A set of pick-off capacitors 620, 622 624, 626 are located underneath proof masses 610 and 612. In one example, pick-off capacitor 620 can be biased with a first voltage such as +5 V, pick-off capacitor 622 can be biased with a second voltage such as +5 V, pick-off capacitors 624 can be biased with a third voltage such as −5 V, and pick-off capacitor 626 can be biased with a fourth voltage such as −5 V.

During operation, the Coriolis acceleration varies the capacitance of pick-off capacitors 620, 622 624, 626 at a dithering frequency along an input axis 640. The present tuning method can be used to adjust the voltages on pick-off capacitors 620, 622, 624, 626 to reduce the sensitivity to a vibration axis 650 (out of the drawing sheet). Optional pick-off capacitors are not shown for sensor device 600, but would be opposite the respective proof mass from the illustrated pick-off capacitors.

The present tuning method can also be applied to various other types of gyroscopes. For example, the present tuning method can be applied to the gyroscopes described in U.S. Pat. No. 8,322,213, entitled Micromachined Tuning Fork Gyroscopes with Ultra-High Sensitivity and Shock Rejection, the disclosure of which is incorporated by reference herein. The present tuning method can also be applied to various disk resonator gyroscopes, such as described in U.S. Pat. No. 7,401,397, entitled Method of Producing an Inertial Sensor, the disclosure of which is incorporated by reference herein.

Figures 7A, 7B:
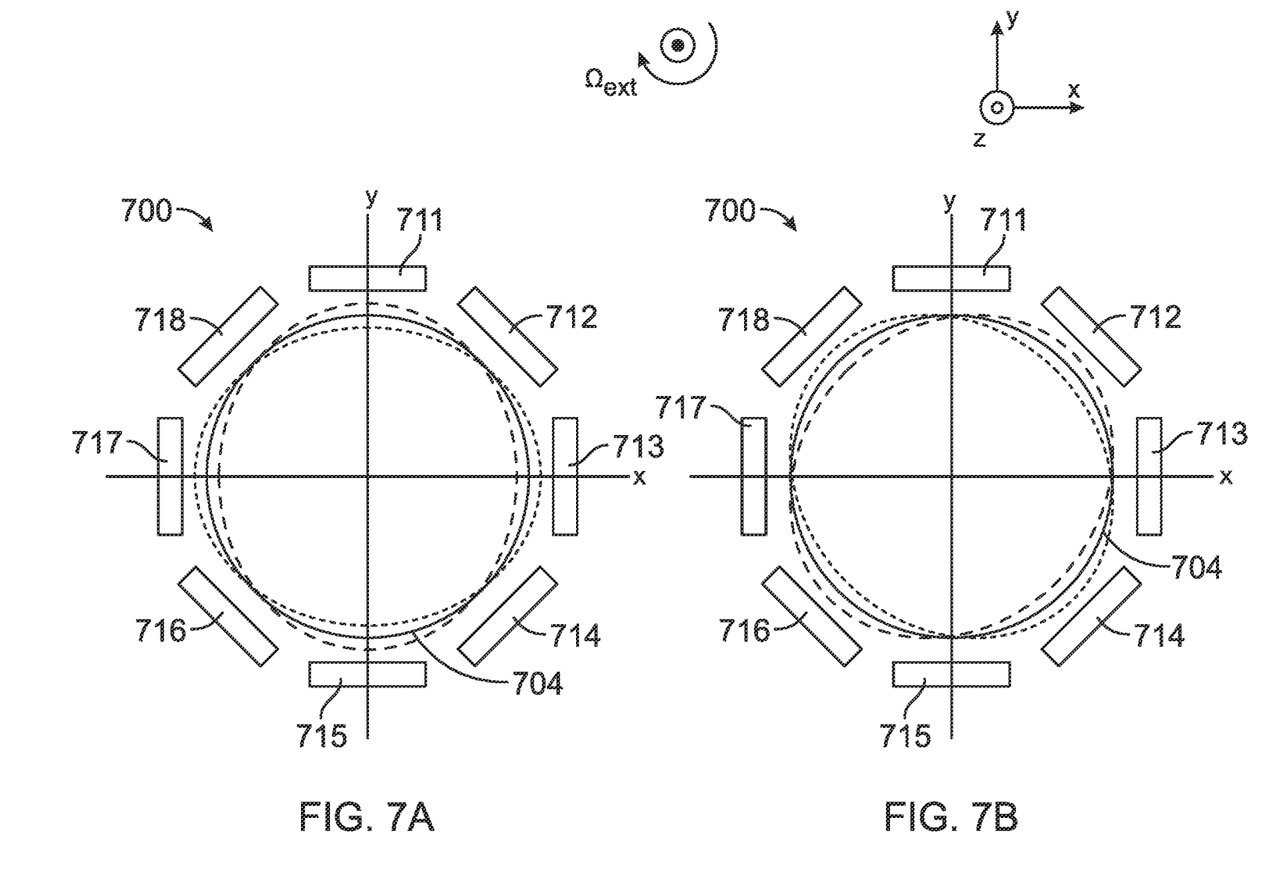
FIGS. 7A and 7B are schematic diagrams of an exemplary wine-glass resonator device, employed as a Coriolis vibratory gyroscope, according to a further embodiment.

FIGS. 7A and 7B are schematic diagrams of an exemplary wine-glass resonator device 700, employed as a Coriolis vibratory gyroscope, for which the present tuning method can be employed. The wine-glass resonator device 700 is commonly also referred to in some embodiments as a bird bath resonator, a hemispherical resonator gyroscope, or a disk resonator gyroscope.

The wine-glass resonator device 700 includes a proof mass 704, which is typically a symmetric circular structure (shown as a circle in this case). The wine-glass resonator device 700 operates typically by driving one of two degenerate N=2 wine-glass modes (shown in FIG. 7A), with a set of pick-off electrodes 711, 713, 715, and 717. The rotation rate is sensed by observing resultant motion that occurs in the other N=2 wine-glass mode (shown in FIG. 7B) due to the Coriolis force coupling energy from the driven mode to the sense mode. This sense mode is measured with pick-off electrodes 712, 714, 716, and 718. Variations of this basic idea include the measurement of other resonate modes such as the N=3 mode, as well as choices to drive the sensor in close loop (force rebalance) vs. open loop (whole angle mode).

Regardless of these variations, wine-glass resonator device 700 fundamentally measures rotation by sensing the vibratory motion of proof mass 704. If the pick-off mechanism for this motion is not perfect, it will be susceptible to vibration. In this example, suppose sense motion is measured using pick-off electrodes 712, 714, 716, and 718. In this case, suppose that the sensitivity of electrode 712 to motion is about 10% stronger than the other three electrodes. If wine-glass resonator device 700 is shaken along a diagonal x-y line stretching from electrode 712 to electrode 716, then an output signal will result which will be indistinguishable from the motion the device is designed to sense from the N=2 mode. To correct for this error, the gain of the pick-off for electrode 712 can be reduced by about 10% to avoid this sensitivity. The wine-glass resonator device 700 can, similar to the embodiments described above, be corrected for any combination of mass, spring, damping, or pick-off gain asymmetries in the system in one or more axes. Thus, the present tuning method applies to this device as well.

It is further important to note that many Coriolis vibratory gyroscopes, such as the wine-glass resonator, are often "tuned" to account for other fabrication variations. These variations might include adjusting the resonant frequencies of the device (in some cases to mode-match two frequencies) or to adjust damping imperfections in the device. While these other tuning methods may be employed in addition to or in complementary ways to the present tuning approach, the other tuning methods fundamentally address other error mechanisms or non-idealities in the device.

Figure 8:
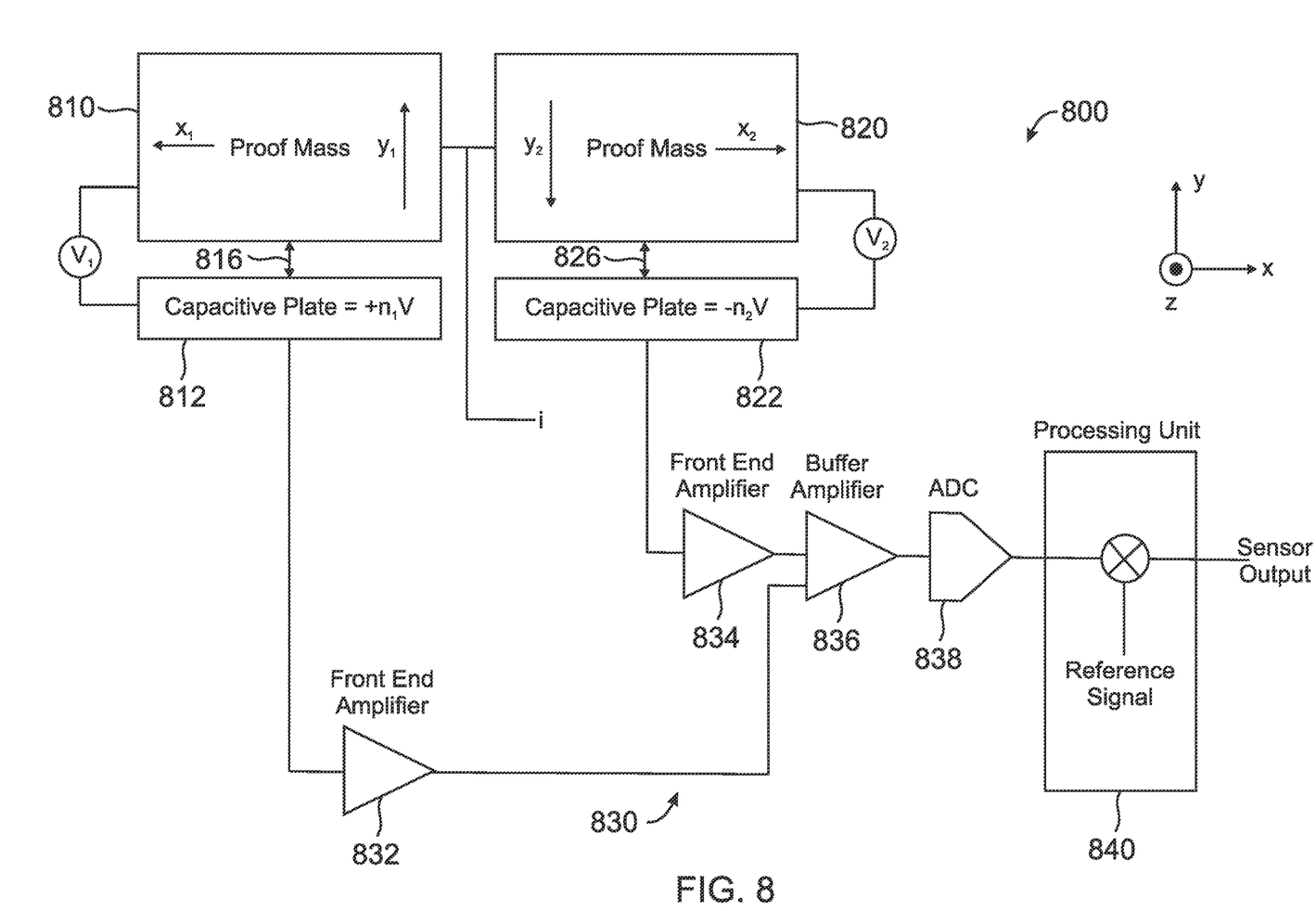
FIG. 8 is a schematic diagram of a pick-off mechanism for a sensor device with two proof masses, according to an exemplary embodiment.

FIG. 8 illustrates further detail of a pick-off mechanism for a sensor device 800, which is similar to sensor device 100 (FIG. 1), according to an exemplary embodiment. It should be understood that the pick-off mechanism shown in FIG. 8 can also be implemented in one or more of the other sensor devices described previously.

The sensor device 800 has a first proof mass 810 and a second proof mass 820. A first capacitive plate 812 is located on one side of proof mass 810, and a second capacitive plate 822 is located on one side of proof mass 820. The proof mass 810 is separated from capacitive plate 812 by a first capacitive gap 816. The proof mass 820 is separated from capacitive plate 822 by a second capacitive gap 826. The capacitive plate 812 is biased with a first voltage ($+n_1$ V), and capacitive plate 822 is biased with a second voltage ($-n_2$ V).

The pick-off mechanism for sensor device 800 comprises a capacitive pick-off chain 830 for sensing motion of proof masses 810, 820, and includes various electronics components. In this embodiment, capacitive pick-off chain 830 includes a first front-end amplifier 832 coupled to capacitive plate 812, and a second front-end amplifier 834 coupled to capacitive plate 822. A buffer amplifier 836 is configured to receive output signals from front-end amplifiers 832, 834, and an analog to digital converter (ADC) 838 is configured to receive an output signal from buffer amplifier 836. A processing unit 840 is configured to receive a digital signal from ADC 838.

During operation of sensor device 800, capacitive plates 812, 822 cause proof masses 810, 820 to be driven along an x-axis, with proof mass 810 moving toward the $x_1$ path, and proof mass 820 moving toward the $x_2$ path, for example. The sensor device 800 is operative to sense the motion of proof masses 810 and 820, which move in opposite directions along a y-axis ($y_1$ and $y_2$ paths) in response to the Coriolis force caused by rotation of sensor device 800 about a z-axis.

The motion of proof masses 810, 820 is measured by the change in the capacitive gaps 816, 826 between proof masses 810, 820 and capacitive plates 812, 822. This motion, combined with the biasing voltages on capacitive plates 812, 822, causes a current to be driven through front-end amplifiers 832, 834. The signals output from front-end amplifiers 832, 834 are buffered with buffer amplifier 836, digitized with ADC 818, and demodulated in processing unit 840, using a reference signal, to produce a sensor output signal.

It should be noted that not all of the above embodiments will require each of the components in the signal processing steps shown in FIG. 8. For example, some embodiments will not include a buffer amplifier, and certain analog output devices may never include a digitization step. Similarly, the order of the signal processing steps may differ in some embodiments. For example, the demodulation step may occur prior to digitization. The above variations notwithstanding, in the example provided by FIG. 8, any combination of the adjustment of the bias voltage, the front-end amplifier gain, the buffer gain, the ADC gain, and/or software gain, before or after demodulation, can be used as the tuning control.

Accordingly, in some implementations, the present tuning method can be accomplished by only changing the electronics gain. For example, the sense bias voltage can be maintained, and the gain can be adjusted in one or more of the other electronics components in the signal processing chain. In other embodiments, a combination of adjusting the pick-off sensitivity and adjusting the electronics gain can be employed.

It is further understood that processing unit software can function within an electronic component or set of electronic components. Thus, it is understood that adjusting an electronics gain of one or more electronics components may include not only adjusting hardware gains (such as in the feedback resistors of an operational amplifier circuit) but also gains accomplished within software (such as numerical coefficients in processing algorithms).

For other types of pick-offs, the gaps and capacitive plates in any of the described embodiments can be replaced with another transduction mechanism, such as a flexure containing a piezoelectric or piezoresistive element, or an optical mechanism capable of interrogating the gap between the proof mass and a stator.

EXAMPLE EMBODIMENTS

Example 1 includes a method comprising: providing one or more sensor devices, wherein each sensor device comprises: one or more proof masses configured to move in response to an external stimulus of interest, wherein the one or more proof masses are also susceptible to move in response to one or more stimuli other than the external stimulus of interest; and one or more pick-off mechanisms respectively associated with each of the one or more proof masses, wherein the one or more pick-off mechanisms is proportionally responsive to a motion of the sensor device; and adjusting gain of one or more of the pick-off mechanisms to reduce an output of each sensor device when the one or more proof masses move in response to the one or more stimuli other than the external stimulus of interest.

Example 2 includes the method of Example 1, wherein each sensor device is a gyroscope, and the external stimulus of interest is a Coriolis force.

Example 3 includes the method of any of Examples 1-2, wherein the one or more stimuli other than the external stimulus of interest include linear vibratory motion or rotational vibratory motion.

Example 4 includes the method of any of Examples 1-3, wherein the one or more pick-off mechanisms comprise a capacitive pick-off, a magneto-electric pick-off, a piezoelectric pick-off, a piezoresistive pick-off, or an optical pick-off.

Example 5 includes the method of any of Examples 1-4, wherein the gain is adjusted individually for each sensor device to correct for fabrication variations that cause individual sensor device parameters to deviate from their designed values.

Example 6 includes the method of any of Examples 1-5, wherein the gain is adjusted for each sensor device to correct for one or more of proof mass imperfections, spring flexure imperfections, damping mismatches, damping coefficient asymmetries, or pick-off gain non-idealities.

Example 7 includes the method of any of Examples 1-6, wherein the one or more pick-off mechanisms comprise one or more capacitive pick-offs; and the gain is adjusted by adjusting a bias voltage of the one or more capacitive pick-offs.

Example 8 includes a sensor device comprising: one or more proof masses configured to move in response to an external stimulus of interest, wherein the one or more proof masses are also susceptible to move in response to one or more stimuli other than the external stimulus of interest; and one or more pick-off mechanisms respectively associated with each of the one or more proof masses, wherein the one or more pick-off mechanisms is proportionally responsive to a motion of the sensor device; wherein a gain of the one or more pick-off mechanisms is adjustable to reduce an output of the sensor device when the one or more proof masses move in response to the one or more stimuli other than the external stimulus of interest.

Example 9 includes the sensor device of Example 8, wherein the sensor device is a gyroscope, and the external stimulus of interest is a Coriolis force.

Example 10 includes the sensor device of any of Examples 8-9, wherein the one or more stimuli other than the external stimulus of interest include linear vibratory motion or rotational vibratory motion.

Example 11 includes the sensor device of any of Examples 8-10, wherein the one or more pick-off mechanisms comprise a capacitive pick-off, a magneto-electric pick-off, a piezoelectric pick-off, a piezoresistive pick-off, or an optical pick-off.

Example 12 includes the sensor device of any of Examples 8-11, wherein the gain is adjustable to correct for one or more of proof mass imperfections, spring flexure imperfections, damping mismatches, damping coefficient asymmetries, or pick-off gain non-idealities.

Example 13 includes the sensor device of any of Examples 8-12, wherein the one or more pick-off mechanisms comprise one or more capacitive pick-offs; and the gain is adjustable by adjustment of a bias voltage of the one or more capacitive pick-offs.

Example 14 includes the sensor device of any of Examples 8-12, wherein the one or more pick-off mechanisms comprise one or more capacitive pick-offs including one or more electronics components; and the gain is adjustable by a technique comprising: (a) adjusting a pick-off sensitivity of the one or more capacitive pick-offs; (b) adjusting an electronics gain of the one or more electronics components; or (c) a combination of (a) adjusting the pick-off sensitivity and (b) adjusting the electronics gain.

Example 15 includes the sensor device of any of Examples 8-14, wherein the one or more proof masses include at least two proof masses.

Example 16 includes the sensor device of any of Examples 8-13, wherein the one or more proof masses comprise a pair of proof masses, including a first proof mass and a second proof mass, the first proof mass including a first proof mass portion and a second proof mass portion, wherein the second proof mass is interposed between the first proof mass portion and the second proof mass portion.

Example 17 includes the sensor device of any of Examples 8-13, wherein the one or more proof masses comprise a single set of four proof masses in a drive mode; and the sensor device provides angle rate information in all three of x, y, and z axes.

Example 18 includes the sensor device of any of Examples 8-13, wherein the one or more proof masses are configured to dither back and forth in an angular fashion.

Example 19 includes the sensor device of any of Examples 8-13, wherein the sensor device is a wine-glass resonator device that includes a proof mass having a symmetric circular structure.

Example 20 includes a gyroscope device, comprising: one or more proof masses configured to be driven into motion along a first path and responsive to a resultant Coriolis force along a second path; and one or more capacitive pick-off mechanisms respectively associated with the one or more proof masses, wherein the one or more capacitive pick-off mechanisms is proportionally responsive to a motion of the sensor device along the second path; wherein a gain of the one or more capacitive pick-off mechanisms is adjustable to reduce an output of the sensor device when the one or more proof masses move in response to a stimulus other than the Coriolis force.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:
1. A sensor device comprising:
two or more proof masses configured to move in response to an external stimulus of interest, wherein the two or more proof masses are also susceptible to move in response to one or more stimuli other than the external stimulus of interest; and
one or more pick-off mechanisms respectively associated with each of the two or more proof masses, wherein the one or more pick-off mechanisms is proportionally responsive to a motion of the sensor device;
wherein the two or more proof masses are configured to move in symmetric common mode motion in response to the one or more stimuli other than the external stimulus of interest, with the one or more pickoff mechanisms respectively arranged to reject the symmetric common mode motion;
wherein a gain, biasing voltage, or sensitivity of the one or more pick-off mechanisms associated with one of the two or more proof masses is independently adjustable with respect to a gain, biasing voltage, or sensitivity of the one or more pick-off mechanisms associated with another of the two or more proof masses, to reduce an output of the sensor device when the two or more proof masses move in response to the one or more stimuli other than the external stimulus of interest, and thereby substantially cancel a total output of the sensor device with respect to the one or more stimuli other than the external stimulus of interest.

2. The sensor device of claim 1, wherein the sensor device is a gyroscope, and the external stimulus of interest is a Coriolis force.

3. The sensor device of claim 1, wherein the one or more stimuli other than the external stimulus of interest include linear vibratory motion or rotational vibratory motion.

4. The sensor device of claim 1, wherein the one or more pick-off mechanisms comprise a capacitive pick-off, a magneto-electric pick-off, a piezoelectric pick-off, a piezoresistive pick-off, or an optical pick-off.

5. The sensor device of claim 1, wherein the gain, biasing voltage, or sensitivity is independently adjustable to correct for one or more of proof mass imperfections, spring flexure imperfections, damping mismatches, damping coefficient asymmetries, or pick-off gain non-idealities.

6. The sensor device of claim 1, wherein:
the one or more pick-off mechanisms comprise one or more capacitive pick-offs respectively associated with each of the two or more proof masses; and
a bias voltage of the one or more capacitive pick-offs associated with one of the two or more proof masses is independently adjustable with respect to a bias voltage of the one or more capacitive pick-offs associated with another of the two or more proof masses.

7. The sensor device of claim 1, wherein:
the one or more pick-off mechanisms comprise one or more capacitive pick-offs including one or more electronics components; and
the gain, biasing voltage, or sensitivity is independently adjustable by a technique comprising:
(a) adjusting a pick-off sensitivity of the one or more capacitive pick-offs;
(b) adjusting an electronics gain of the one or more electronics components; or
(c) a combination of (a) adjusting the pick-off sensitivity and (b) adjusting the electronics gain.

8. The sensor device of claim 1, wherein the two or more proof masses comprise a first proof mass and a second proof mass, the first proof mass including a first proof mass portion and a second proof mass portion, wherein the second proof mass is interposed between the first proof mass portion and the second proof mass portion.

9. The sensor device of claim 1, wherein:
the two or more proof masses comprise a single set of four proof masses in a drive mode; and
the sensor device provides angle rate information in all three of x, y, and z axes.

10. The sensor device of claim 1, wherein the two or more proof masses are configured to dither back and forth in an angular fashion.

11. The sensor device of claim 1, wherein the gain, biasing voltage, or sensitivity of the respective one or more pick-off mechanisms are independently adjustable to correct for one or more imperfections in the sensor device.

12. A method comprising:
providing one or more sensor devices, wherein each sensor device comprises:
two or more proof masses configured to move in response to an external stimulus of interest, wherein the two or more proof masses are also susceptible to move in response to one or more stimuli other than the external stimulus of interest; and
one or more pick-off mechanisms respectively associated with each of the two or more proof masses, wherein the one or more pick-off mechanisms is proportionally responsive to a motion of the sensor device;
wherein the two or more proof masses are configured to move in symmetric common mode motion in response to the one or more stimuli other than the external stimulus of interest, with the one or more pickoff mechanisms respectively arranged to reject the symmetric common mode motion; and
adjusting a gain, biasing voltage, or sensitivity of one or more of the pick-off mechanisms associated with one of the two or more proof masses, independently, with respect to a gain, biasing voltage, or sensitivity of the one or more pick-off mechanisms associated with another of the two or more proof masses, to reduce an output of each sensor device when the two or more proof masses move in response to the one or more stimuli other than the external stimulus of interest, and thereby substantially canceling a total output of each sensor device with respect to the one or more stimuli other than the external stimulus of interest.

13. The method of claim 12, wherein each sensor device is a gyroscope, and the external stimulus of interest is a Coriolis force.

14. The method of claim 12, wherein the one or more stimuli other than the external stimulus of interest include linear vibratory motion or rotational vibratory motion.

15. The method of claim 12, wherein the one or more pick-off mechanisms comprise a capacitive pick-off, a magneto-electric pick-off, a piezoelectric pick-off, a piezoresistive pick-off, or an optical pick-off.

16. The method of claim 12, wherein the gain, biasing voltage, or sensitivity is adjusted individually for each sensor device to correct for fabrication variations that cause individual sensor device parameters to deviate from their designed values.

17. The method of claim 12, wherein the gain, biasing voltage, or sensitivity is adjusted individually for each sensor device to correct for one or more of proof mass imperfections, spring flexure imperfections, damping mismatches, damping coefficient asymmetries, or pick-off gain non-idealities.

18. The method of claim 12, wherein:
the one or more pick-off mechanisms comprise one or more capacitive pick-offs respectively associated with each of the two or more proof masses; and
a bias voltage of the one or more capacitive pick-offs associated with one of the two or more proof masses is adjusted independently with respect to a bias voltage of the one or more capacitive pick-offs associated with another of the two or more proof masses.

* * * * *